(12) United States Patent
Suzuki et al.

(10) Patent No.: US 11,476,615 B2
(45) Date of Patent: Oct. 18, 2022

(54) CONNECTOR WITH IMPROVED VIBRATION RESILIENCE

(71) Applicant: Yazaki Corporation, Tokyo (JP)

(72) Inventors: Takatoshi Suzuki, Shizuoka (JP); Yoshitaka Tsushima, Shizuoka (JP); Yasuhiro Tanaka, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 17 days.

(21) Appl. No.: 17/177,177

(22) Filed: Feb. 16, 2021

(65) Prior Publication Data
US 2021/0257776 A1 Aug. 19, 2021

(30) Foreign Application Priority Data

Feb. 18, 2020 (JP) .............................. JP2020-025422

(51) Int. Cl.
| | |
|---|---|
| *H01R 13/58* | (2006.01) |
| *H01R 4/18* | (2006.01) |
| *H01R 13/41* | (2006.01) |
| *H01R 13/502* | (2006.01) |

(52) U.S. Cl.
CPC ......... *H01R 13/5808* (2013.01); *H01R 4/185* (2013.01); *H01R 13/41* (2013.01); *H01R 13/502* (2013.01)

(58) Field of Classification Search
CPC .... H01R 4/185; H01R 13/5808; H01R 13/41; H01R 13/502
USPC ....................................................... 439/456
See application file for complete search history.

(56) References Cited

U.S. PATENT DOCUMENTS

| | | | | |
|---|---|---|---|---|
| 7,597,580 | B1 * | 10/2009 | Advey ................. | H01R 13/533 439/272 |
| 8,182,278 | B2 * | 5/2012 | Kataoka ................. | H01R 24/62 439/266 |
| 9,039,463 | B2 * | 5/2015 | Yamashita ........... | H01R 13/187 439/852 |
| 9,124,024 | B2 * | 9/2015 | Itsuki ..................... | H01R 24/20 |
| 9,153,901 | B2 * | 10/2015 | Yamashita ........... | H01R 13/533 |
| 9,368,902 | B2 * | 6/2016 | Nakai ................. | H01R 13/5202 |
| 9,620,899 | B2 * | 4/2017 | Kato .................... | H01R 13/631 |
| 9,653,843 | B2 * | 5/2017 | Suzuki .................. | H01R 13/58 |
| 10,128,607 | B2 * | 11/2018 | Lane .................. | H01R 13/5202 |
| 10,305,215 | B2 * | 5/2019 | Tomita ................. | H01B 7/0045 |

(Continued)

FOREIGN PATENT DOCUMENTS

| | | |
|---|---|---|
| EP | 3 675 287 A1 | 7/2020 |
| JP | 2014-86349 A | 5/2014 |
| WO | 2014/069285 A1 | 5/2014 |

*Primary Examiner* — Peter G Leigh
(74) *Attorney, Agent, or Firm* — Kenealy Vaidya LLP

(57) ABSTRACT

The present invention is provided with: a terminal metal fitting to which a core wire exposed portion of a core wire of a terminal of a wire is physically and electrically connected; a housing inside which the terminal metal fitting and the terminal of the wire are housed and from which the wire is drawn outside from inside; and a wire holding member that holds, inside the housing, the terminal of the wire, in which the wire holding member has a fixed portion that is fixed to a fixing portion inside the housing, and a holding portion that holds the terminal of the wire so that the terminal of the wire does not move relatively to the housing when the fixed portion is fixed to the fixing portion.

10 Claims, 10 Drawing Sheets

(56) References Cited

U.S. PATENT DOCUMENTS

| | | | |
|---|---|---|---|
| 10,355,400 B2* | 7/2019 | Yokoyama | H01R 4/70 |
| 2006/0086900 A1* | 4/2006 | Nakamura | H01R 13/6633 |
| | | | 250/239 |
| 2014/0120763 A1* | 5/2014 | Itsuki | H01R 13/533 |
| | | | 439/382 |
| 2015/0229067 A1 | 8/2015 | Nakai et al. | |
| 2019/0190192 A1* | 6/2019 | Mori | H01R 13/621 |
| 2019/0296494 A1* | 9/2019 | Kitagawa | H01R 13/639 |

* cited by examiner

CONNECTOR WITH IMPROVED VIBRATION RESILIENCE

CROSS-REFERENCE TO RELATED APPLICATION(S)

The present application claims priority to and incorporates by reference the entire contents of Japanese Patent Application No. 2020-025422 filed in Japan on Feb. 18, 2020.

BACKGROUND OF THE INVENTION

1. Field of the Invention

The present invention relates to a connector.

2. Description of the Related Art

Conventionally, in a connector, wires connected to terminal metal fittings within the housing are drawn outside the housing. This type of connector is disclosed in WO 2014/069285 A, for example.

Incidentally, the connector may sometimes be installed at a point where vibrations, such as those of a vehicle, for instance an automobile, are generated. In such a case, relative displacement of the connector caused by these vibrations, which is generated between the side of the housing and a wire outside the housing, may continually recur. At such time, due to the continual recurrence of this displacement of the connector, the wire outside the housing starts to sway relatively to the side of the housing, and hence this swaying is likely to be transmitted to the terminal metal fittings inside the housing. For the terminal metal fittings, the transmitted swaying of the wire represents an external input and is likely to increase the contact resistance between one terminal metal fitting and a counterpart terminal metal fitting.

SUMMARY OF THE INVENTION

It is therefore an object of the present invention to provide a connector that exhibits increased vibration resilience.

In order to achieve the above mentioned object, a connector according to one aspect of the present invention includes a terminal metal fitting to which a core wire exposed portion of a core wire of a terminal of a wire is physically and electrically connected; a housing inside which the terminal metal fitting and the terminal of the wire are housed and from which the wire is drawn outside the housing from inside, the housing; and a wire holding member that holds, inside the housing, the terminal of the wire, wherein the wire holding member has a fixed portion that is fixed to a fixing portion inside the housing, and a holding portion that holds the terminal of the wire so that the terminal of the, wire does not move relatively to the housing when the fixed portion is fixed to the fixing portion.

According to another aspect of the present invention, in the connector, it is possible to configure that the fixing portion and the fixed portion are formed such that the fixed portion is fixed through press-fitting to the fixing portion.

According to still another aspect of the present invention, in the connector, it is possible to configure that the fixing portion, the fixed portion, and the holding portion are formed such that the terminal of the wire is held from both sides between the holding portion and the housing when the fixed portion is fixed to the fixing portion.

According to still another aspect of the present invention, in the connector, it is possible to configure that the wire holding member is molded from a conductive material and has a connecting portion that is connected to a connected portion of the core wire exposed portion further on the terminal metal fitting side than the holding portion of the terminal of the wire; and an electrical tested portion that is tested using an electrical test instrument which is inserted into the housing from outside of the housing.

According to still another aspect of the present invention, in the connector, it is possible to configure that the core wire exposed portion of the terminal of the wire is divided into: a first core wire terminal portion, which is physically and electrically connected to the terminal metal fitting, and which is drawn out from the terminal metal fitting so as to have an orientation opposite to an insertion direction of the terminal metal fitting with respect to the housing; and a second core wire terminal portion, which is bent so as to intersect the first core wire terminal portion, and the connecting portion is connected to the connected portion of the second core wire terminal portion.

According to still another aspect of the present invention, in the connector, it is possible to configure that the electrical tested portion is formed so as to be fired through press-fitting to the housing.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

An embodiment of a connector according to the present invention will be described in detail hereinbelow on the basis of the drawings. Note that the present invention is not limited to or by the embodiment.

Embodiment

One embodiment of a connector according to the present invention will now be described on the basis of FIGS. 1 to 10.

Figure 5:
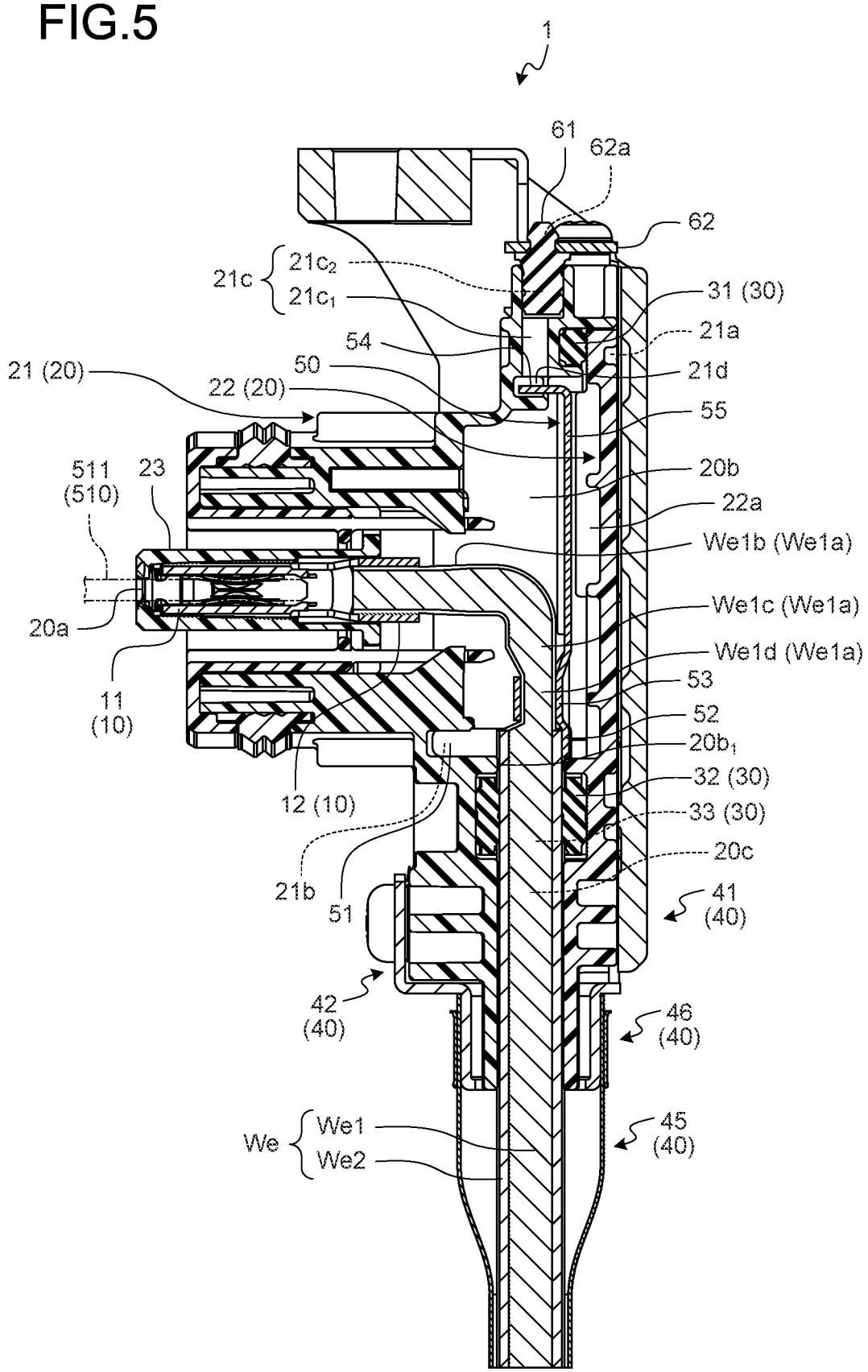
FIG. 5 is a cross-sectional view along line X-X in FIG. 4.

Reference sign 1 of FIGS. 1 to 6 denotes the connector according to the present embodiment. The connector i is physically or electrically connected to a counterpart connector (not illustrated) constituting a connection target. The counterpart connector is, for example, provided to a device (hereinafter called an "electrical connection target") which is the target of an electrical connection via the connector 1, and is provided to the casing (not illustrated) or the like of the electrical connection target (not illustrated). As long as the electrical connection target is the target of an electrical connection via the connector 1, the electrical connection target may take any given form. The counterpart connector has a counterpart housing (not illustrated) provided to the casing of the electrical connection target, and a counterpart terminal metal fitting 510 is disposed on the inside of the counterpart housing (FIG. 5).

The connector 1 is provided with conductive terminal metal fittings 10 that are physically and electrically connected to the counterpart terminal metal fitting 510 (FIGS. 1 to 5). The terminal metal fittings 10 are molded from a conductive material such as a metal.

Figure 6:
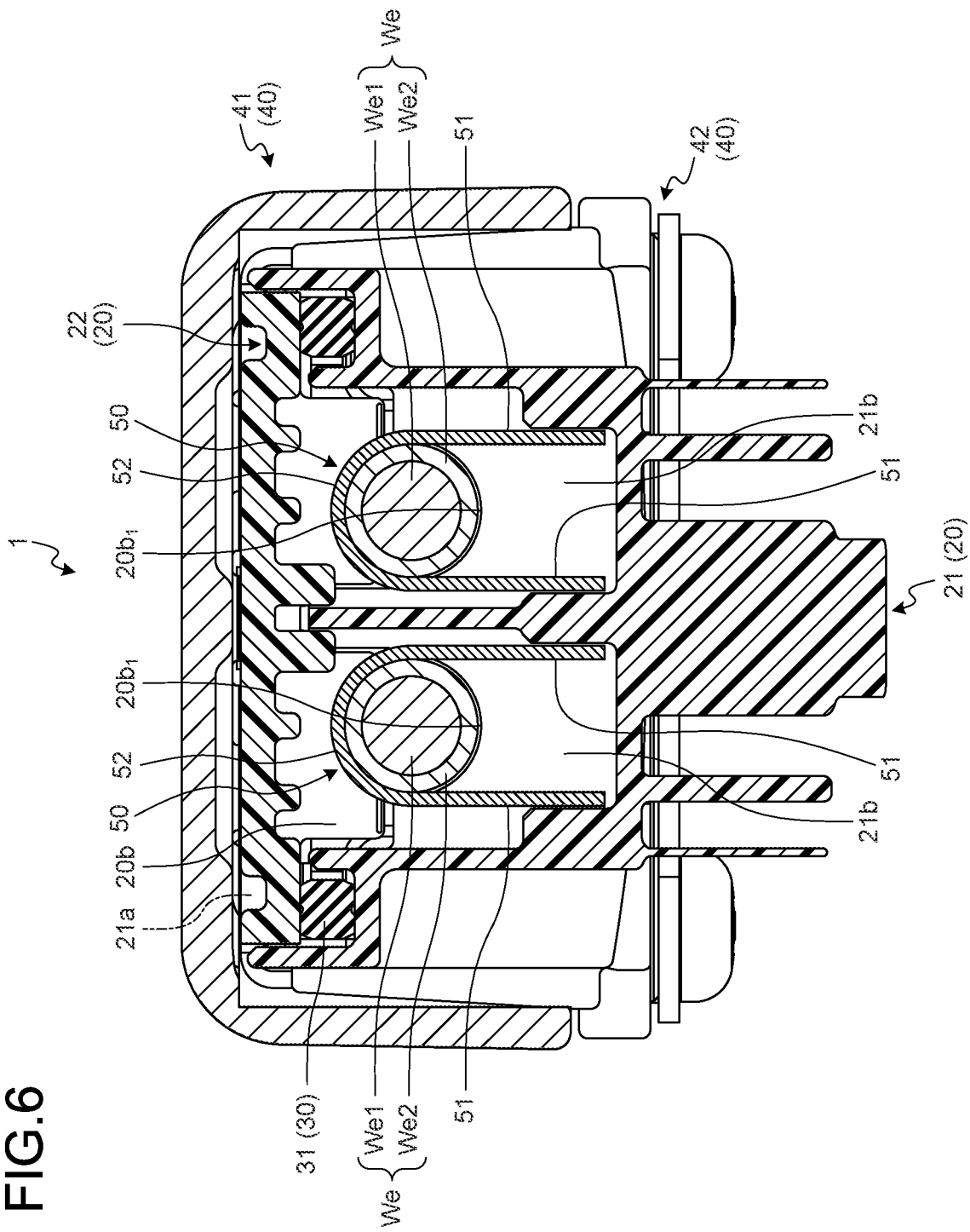
FIG. 6 is a cross-sectional view along line Y-Y in FIG. 4.
Figure 7:
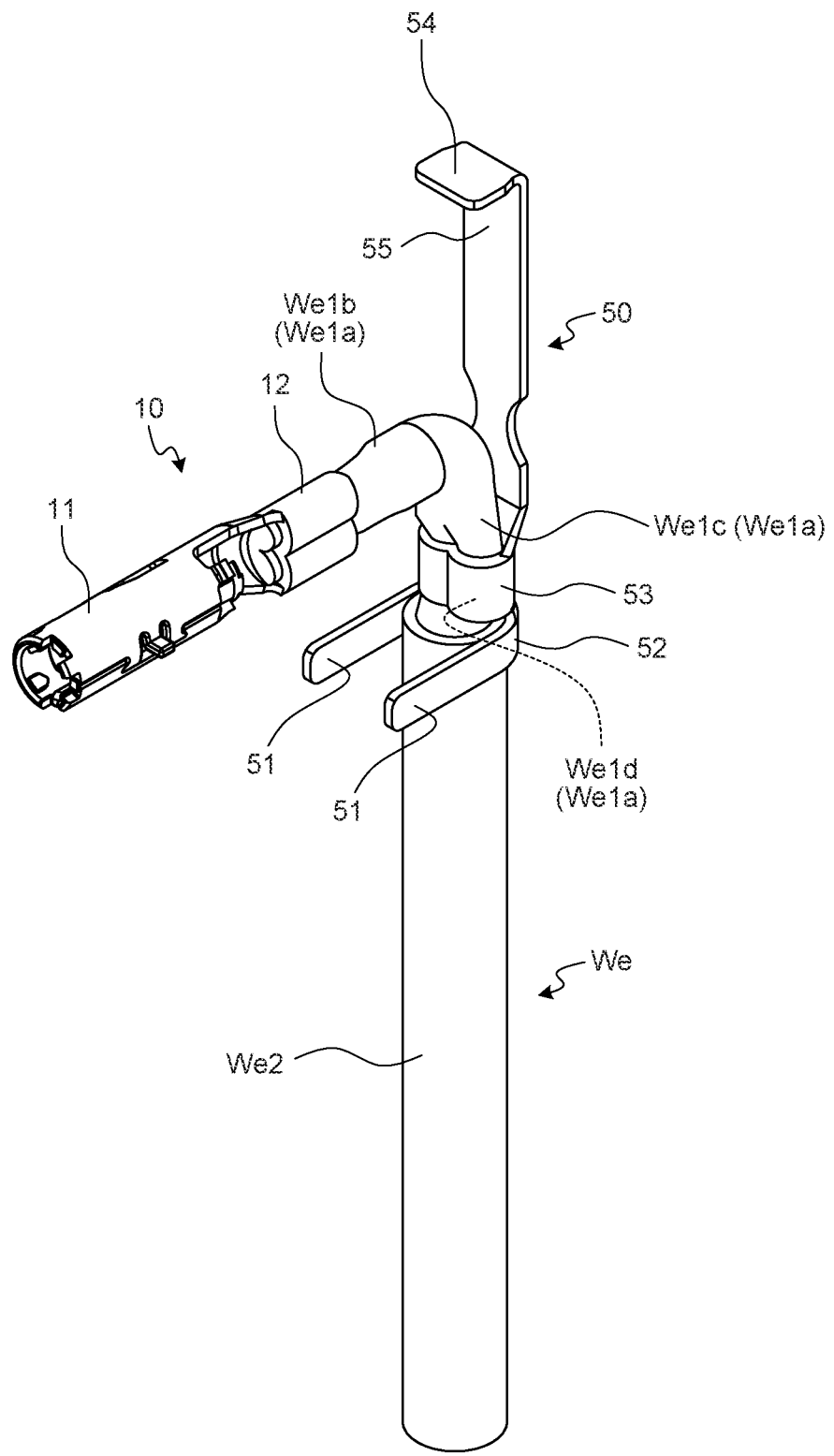
FIG. 7 is a perspective view of a terminal-equipped wire to which a wire holding member is connected.

The terminal metal fittings 10 each have a terminal connecting portion 11 that is physically and electrically connected to a counterpart terminal connecting portion 511 of the counterpart terminal metal fitting 510 (FIGS. 5 to 7). The terminal connecting portion 11 and counterpart terminal connecting portion 511 may have any kind of structure that affords a mutual physical connection. For example, here, the connector 1 is ⁻inserted into/removed from the counterpart connector along a connector insertion/removal direction (a connector insertion direction and a connector removal direction), and the terminal connecting portion 11 is inserted into/removed from the counterpart terminal connecting portion 511 during the insertion/removal of the former. Thus, the terminal connecting portion 11 and counterpart terminal connecting portion 511 are physically and electrically connected to each other by being matingly connected. For example, the terminal connecting portion 11 and terminal connecting portion 511 are formed such that one of these connecting portions has a female terminal shape, and the other of the connecting portions has a male terminal shape. Here, the terminal connecting portion 11 is formed having a female terminal shape, and the terminal connecting portion 511 is formed having a male terminal shape.

Furthermore, the terminal metal fittings 10 each have a wire connecting portion 12 that is physically and electrically connected to a core wire exposed portion We1$a$ of a core wire We1 of the terminal of a wire We (FIGS. 5 and 7). For example, the wire connecting portion 12 may be crimped, through crimping or the like, to the core wire exposed portion We1$a$, or may be fixed thereto through welding or the like. Here, the wire connecting portion 12 is crimped to the core wire exposed portion We1$a$. The terminal of the wire We is drawn out from the wire connecting portion 12 along the axial direction thereof.

In the terminal metal fitting 10, the connector removal direction of the terminal connecting portion 11 and the direction in which the terminal of the wire We is withdrawn from the wire connecting portion 12 are aligned to have the same orientation. For example, the terminal metal fitting 10 illustrated here is molded to have a straight shape which is obtained by arranging the terminal connecting portion 11 and the wire connecting portion 12 in a linear manner.

The connector 1 of this example comprises a plurality of sets of terminal-equipped wires formed by combining the wire We with a pair of terminal metal fittings 10. Here, two sets of terminal-equipped wires are provided.

Furthermore, the connector 1 is provided with a housing 20 inside which the terminal metal fittings 10 and the terminals of the wires We are housed, the wires We being drawn outside the housing 20 from the interior thereof (FIGS. 1 to 6, and FIG. 8). The housing 20 is molded from an insulating material such as synthetic resin.

The housing 20 has a first housing chamber 20$a$ in which the terminal metal fitting 10 is housed, and a second housing chamber 20$b$ and a third housing chamber 20$c$ in which the terminal of the wire We is housed (FIGS. 1, 2, 5, and 8). On the inside of the housing 20, the second housing chamber 20$b$ is made to communicate directly with each of the first housing chamber 20$a$ and third housing chamber 20$c$, and the first housing chamber 20$a$ and third housing chamber 20$c$ are made to communicate indirectly via the second housing chamber 20$b$. In the housing 20, the first housing chamber 20$a$ and second housing chamber 20$b$ are arranged side by side in the connector insertion/removal direction.

The first housing chamber 20$a$ is formed in a cylindrical internal space in the housing 20. The cylinder axis direction of the cylinder of the first housing chamber 20$a$ is the connector insertion/removal direction. The second housing chamber 20$b$ is formed in a rectangular internal space in the housing 20 and is made to communicate with the first housing chamber 20$a$ via a circular opening at one end thereof in a cylinder axis direction. The core wire expose. portion We1$a$ of the terminal of the wire We is housed in the second housing chamber 20$b$. Furthermore, the third housing chamber 20$c$ is formed a cylindrical internal space in the housing 20 and is made to communicate with the second housing chamber 20$b$ via a circular opening at one end thereof in a cylinder axis direction. The section (hereinafter called "the coated section") of core wire We1 of the terminal of the wire We which is covered by a coating We2 is housed in the second housing chamber 20$b$ and third housing chamber 20$c$. This wire We is drawn outside via a circular opening at the other end of the third housing chamber 20$c$ in the cylinder axis direction thereof.

The housing 20 is provided with a housing main body 21, and a cover member 22 that is attached to the housing main body 21 and that covers an opening 21$a$ in the housing main body 21 (FIGS. 1, 2, 5, and 6). This opening 21$a$ is an insertion opening for when the terminal metal fitting 10 is housed in the first housing chamber 20$a$, and is an insertion opening for when the terminal of the wire We is housed in the second housing chamber 20$b$ and the third housing chamber 20$c$. In this example, the terminal metal fitting 10 and the terminal of the wire We, which are in a connected state, are inserted via the opening 21$a$ and with the same orientation as the connector insertion direction. The direction of insertion, via the opening 21$a$, of the terminal metal fitting 10 and the terminal of the wire We is an insertion direction with respect to the housing 20. In the housing 20, the internal space of a cylindrical body 23 provided to the cylindrical internal space in the housing main body 21 is utilized as the first housing chamber 20$a$ (FIGS. 1, 3 to 5, and 8). The cylindrical body 23 (the first housing chamber 20$a$) is provided to each terminal metal fitting 10. Furthermore, in the housing 20, the second housing chamber 20$b$ and third housing chamber 20$c$ are formed in a space which is surrounded by the housing main body 21 and cover member 22. The second housing chamber 20$b$ of this example is partitioned for each wire We. In addition, the third housing chamber 20$c$ of this example is provided to each wire We.

Here, the core wire exposed portion We1$a$ of the terminal of the wire We is divided into: a first core wire terminal portion We1b, which is physically and electrically connected to the terminal connecting portion 11 of the terminal metal fitting 10, and which is drawn out from the wire connecting portion 12 of the terminal metal fitting 10 so as to have an orientation opposite to the insertion direction of the terminal metal fitting 10 with respect to the housing 20; and a second core wire terminal portion We1c, which is bent so as to intersect the first core wire terminal portion We1b (FIGS. 5 and 7). The coated section of the terminal of the wire We is made to extend from the second core wire terminal portion We1c in the axial direction of the second core wire terminal portion We1c, within the second housing chamber 20b and third housing chamber 20c. Accordingly, the respective cylinder axes of the first housing chamber 20a and third housing chamber 20c are made to cross so as to match the crossing angles of the first core wire terminal portion We1b and second core wire terminal portion We1c.

The first core wire terminal portion We1b and second core wire terminal portion Web of the core wire exposed portion We1a of this example are made to intersect at right angles. Thus, the respective cylinder as of the first housing chamber 20a and third housing chamber 20c of this example are made to intersect at right angles. That is, in the housing 20, the wires We are drawn out in a direction orthogonal to the connector insertion/removal direction.

Figure 1:
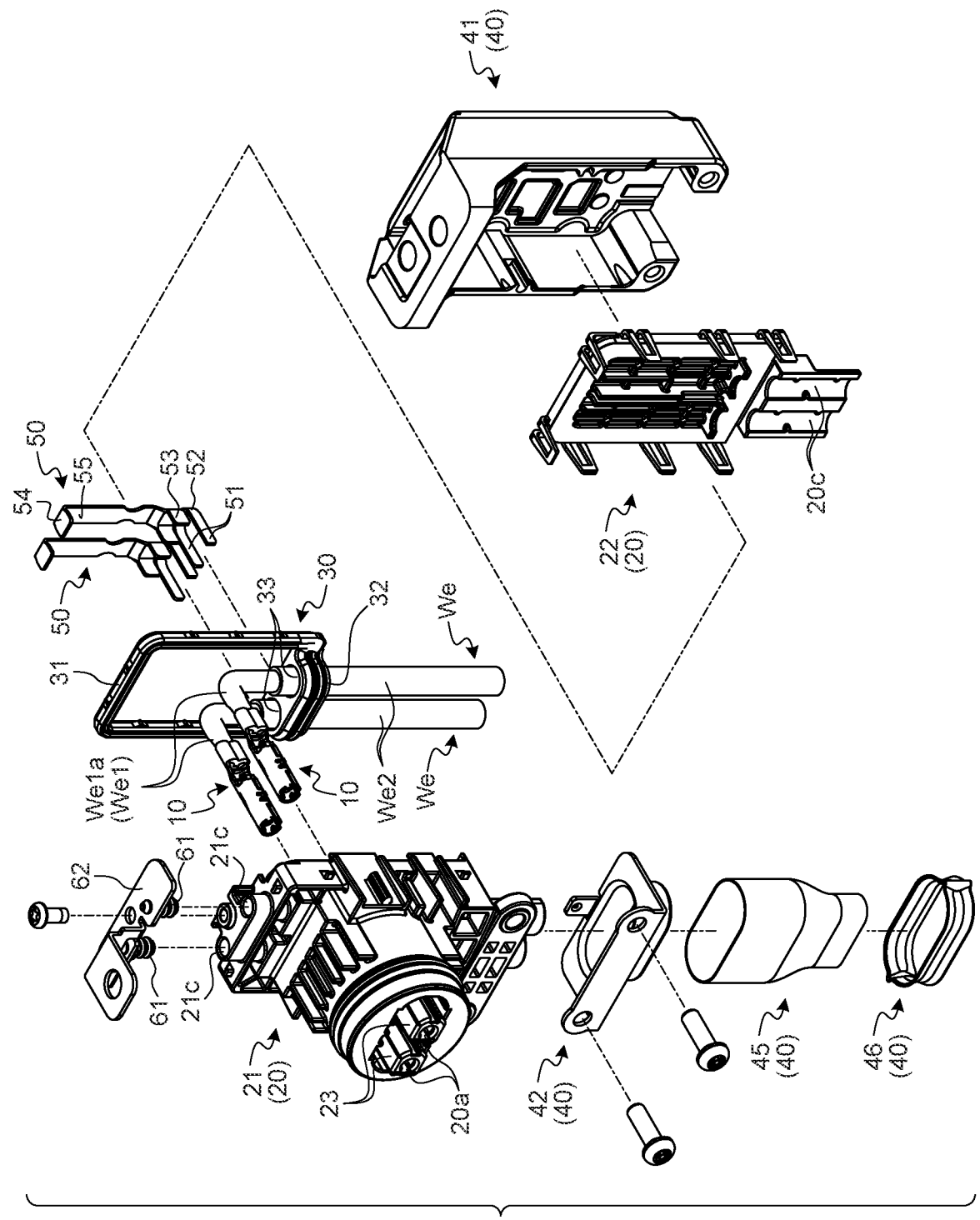
FIG. 1 is an exploded perspective view of a connector according to an embodiment.
Figure 2:
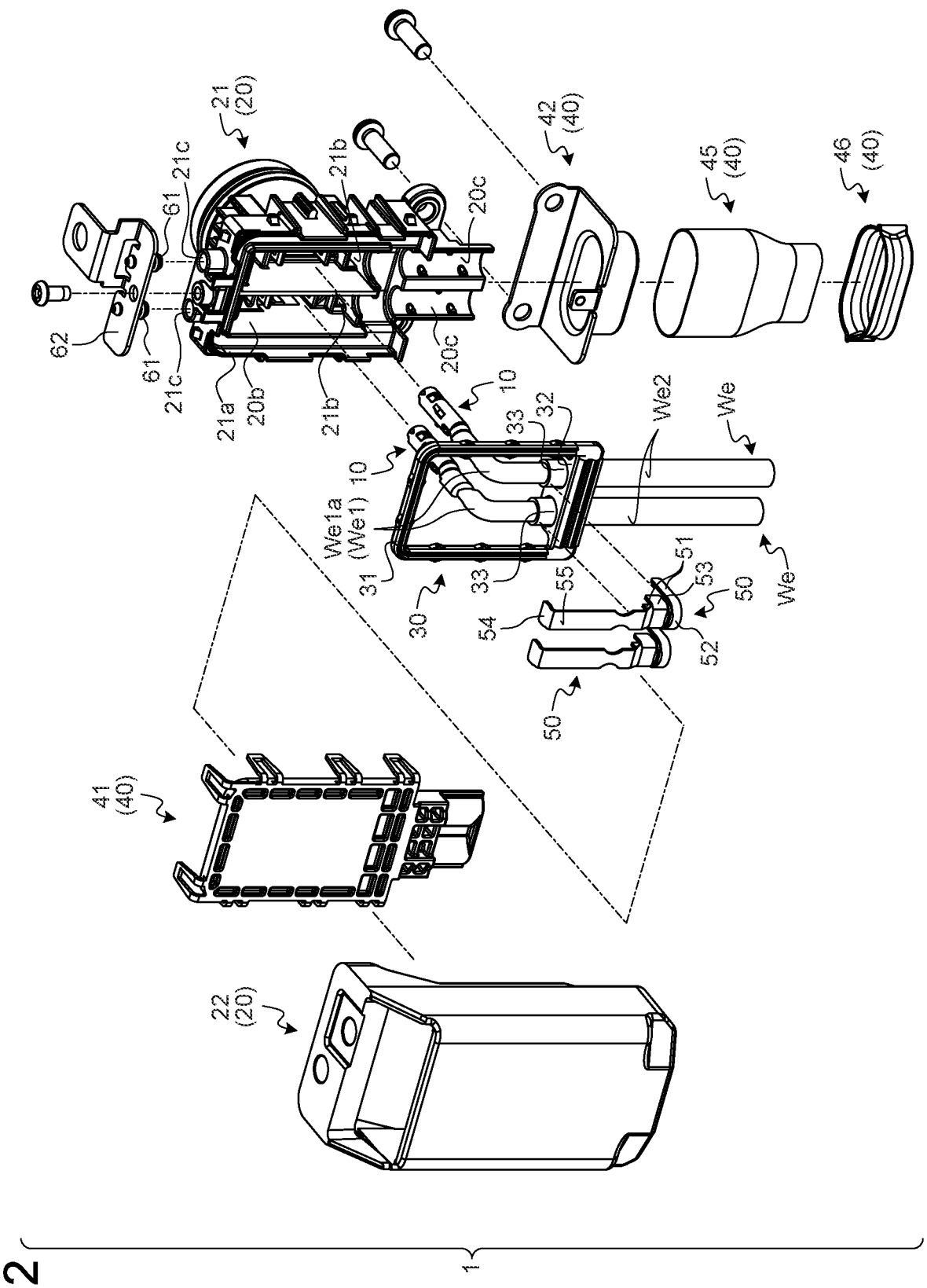
FIG. 2 is an exploded perspective view in which the connector according to the embodiment is viewed from a different angle.
Figure 3:
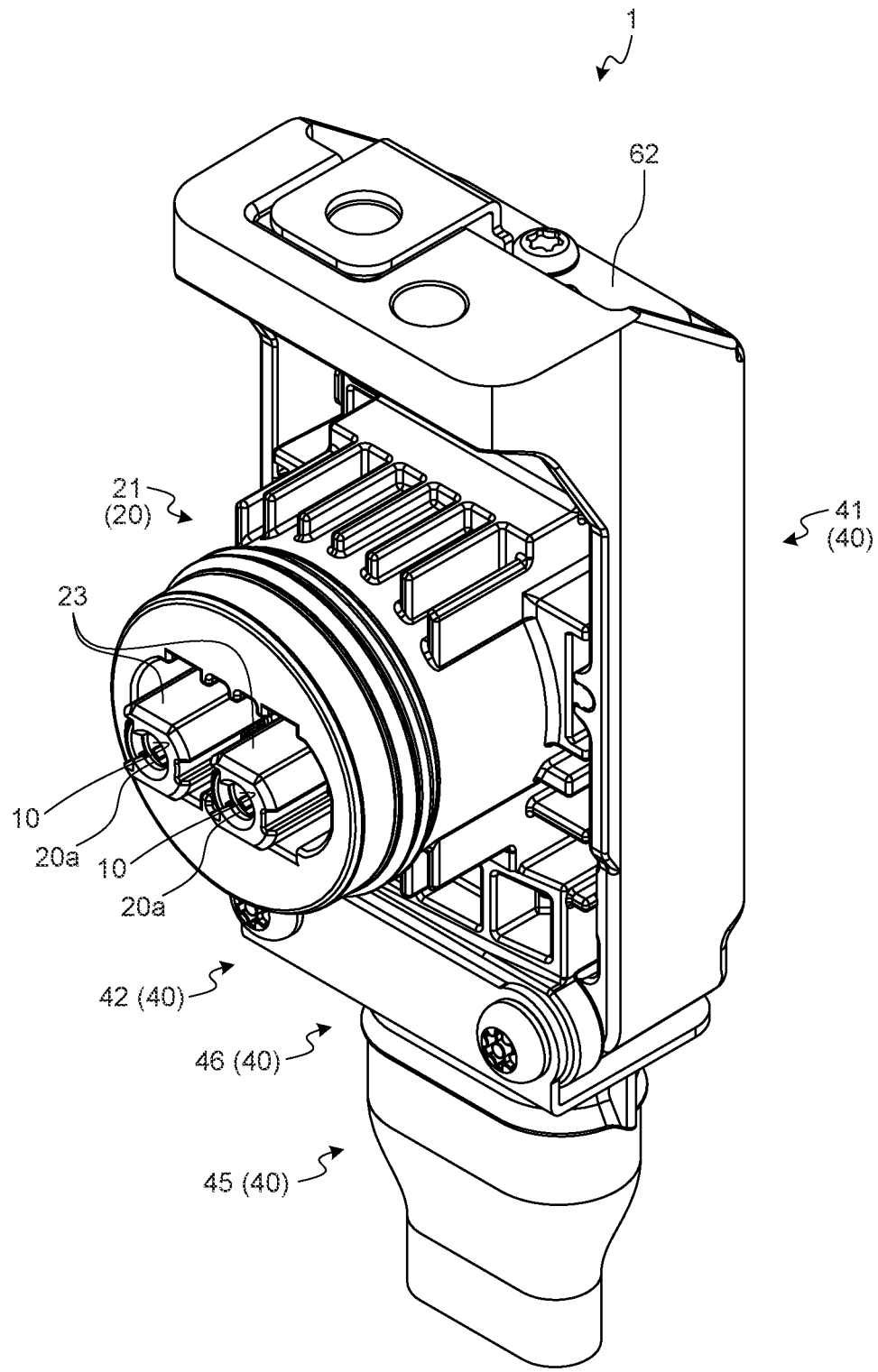
FIG. 3 is a perspective view of the connector according to the embodiment.
Figure 4:
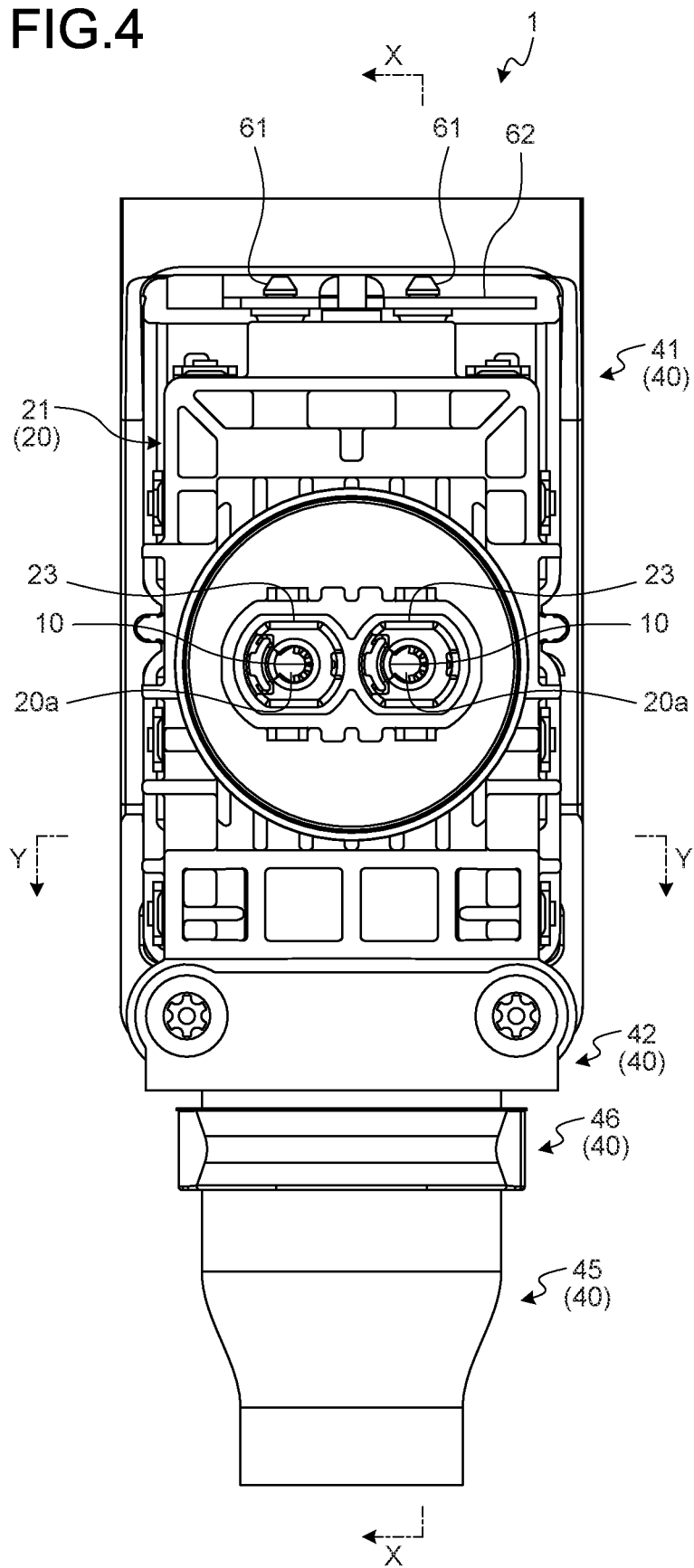
FIG. 4 is a plan view in which the connector according to the embodiment is viewed from the front.

This housing 20 is provided with a waterproof member 30 that covers the gap between the housing main body 21 and the cover member 22, and the gap between the outer circumferential surface of the coated section of the terminal of the wire We, and the inner wall surface of a space section formed by the housing main body 21 and cover member 22 (FIGS. 1 and 2). The waterproof member 30 is so-called waterproof packing material molded from an elastic material such as synthetic rubber.

The waterproof member 30 of this example has a rectangular frame body 31; and an expanding body 32 provided in an expanded state to one side of the frame body 31 (FIGS. 1 and 2). In the waterproof member 30, the gap between the housing main body 21 and the cover member 22 is covered by the frame body 31 and the expanding body 32. The waterproof member 30 of this example is housed in the second housing chamber 20b, and the expanding body 32 is disposed at the end of the second housing chamber 20b on the third housing chamber 20c side thereof. Accordingly, the expanding body 32 of this example has, for each coated section of the terminal of the wire We, a through-hole 33 through which the coated section is inserted and which is placed in close contact with the outer circumferential surface of the coated section (FIGS. 1 and 2). In this waterproof member 30, the gap between the outer circumferential surface of the coated section of the terminal of the wire We and the inner wall surface of the second housing chamber 20b formed by the housing main body 21 and the cover member 22 is covered by the expanding body 32 and one side of the frame body 31 whereon the expanding body 32 is provided.

Furthermore, the connector 1 is provided with a shield shell 40 to prevent noise from outside from infiltrating the housing 20, by covering the housing 20 from the outside (FIGS. 1 to 6). The shield shell 40 is molded from a conductive material such as a metal.

The shield shell 40 of this example is provided with a first shield member 41 that covers, from the cover member 22 side, the second housing chamber 20b formed by the housing main body 21 and the cover member 22; and a second shield member 42 that covers the third housing chamber 20c formed by the housing main body 21 and cover member 22 (FIGS. 1 to 5). The first shield member 41 and second shield member 42 are snap-locked together, with the housing main body 21 interposed therebetween.

Furthermore, the connector 1 is provided with a braid 45 that covers the third housing chamber 20c by covering the second shield member 42 from the outside, and covers, from the outside, the wire We which has been drawn outside from the third housing chamber 20c (FIGS. 1 to 5). The braid 45 is molded from a conductive material such a metal The braid 45 is obtained by braiding linear conductors in a cylindrical shape, and the second shield member 42 and the wire We are housed therein. In the connector 1, an annular shielding ring 46 is provided that, together with the second shield member 42, holds the braid 45 from both sides, and the braid 45 is fixed to the second shield member 42 through staking by means of the shielding ring 46 (FIGS. 1 to 5).

The connector 1 is also provided with a wire holding member 50 that holds the terminal of the wire We inside the housing 20 (FIGS. 1, 2, 5, and 7). As long as the wire holding member 50 only has a function for holding the terminal of the wire We, the wire holding member may be molded from an insulating material such as a synthetic resin, or may be molded from a conductive material such as a metal. However, if the wire holding member 50 is to have an electrical-testing function (described subsequently) in addition to the function for holding the terminal of the wire We, a wire holding member that is molded from a conductive material such as a metal is employed. The wire holding member 50 is provided to each terminal of the wires We.

The wire holding member 50 has fixed portions 51 which are fixed to a fixing portion 21b of the housing 20; and a holding portion 52, which holds the terminal of the wire We so that the terminal of the wire We does not move relatively to the housing 20 when the fixed portions 51 are fixed to the fixing portion 21b (FIGS. 1, 2, 5 to 7, and The holding portion 52 is made to hold a section of the terminal of the wire We inside the housing 20 to which the wire connecting portion 12 of the terminal metal fitting 10 is not connected Due to this configuration, even if swaying, caused by vibrations and the like in the wire We drawn outside the housing 20, occurs, the connector 1 is capable of suppressing the transmission of the swaying further on the terminal metal fittings 10 side than the holding portion 52 of the terminal of the wire We. Thus, the connector 1 capable of suppressing an increased contact resistance between the terminal connecting portions 11 and terminal connecting portions 511, and hence enables vibration resilience performance to be improved.

In this example, the holding portion 52 is formed with a semi-cylindrical shape, and the fixed portions 51 are provided at the respective ends of the holding portion 52 in a circumferential direction, the fixed portions 51 having the rectangular single body shape of a cantilever for which said ends serve as fixing ends. Here, the rectangular single body-shaped fixed portions 51 are each made to protrude in a tangential direction from the two ends of the holding portion 52 in the circumferential direction. That is, a U-shaped wire holding body consisting of two fixed portions 51 and one holding' portion 52 is formed in the wire holding member 50 of this example.

In the wire holding body, the cylinder axis direction of the holding portion 52 and the axial direction of the terminal of the wire We are aligned to have the same orientation, and the terminal of the wire We is inserted on the inside of the U shape. For example, the holding portion 52 illustrated here is formed such that the radius of the inner circumferential surface thereof has the same size as the radius of the outer circumferential surface of the terminal of the wire We, and the terminal of the wire We is fitted concentrically to the inner circumferential surface. Further, the length in the protrusion direction of the fixed portions 51 illustrated here is made longer than the radius of the outer circumferential surface of the terminal of the wire We, and the end on the protrusion direction side is made to protrude further than the terminal of the wire We fitted into the holding portion 52. The protruding sections of the fixed portions 51 in this example are fixed co the fixing portion 21b on the inside of the housing 20.

The fixing portion 21b and fixed portions 51 illustrated here are formed to enable the fixed portions 51 to be press-fitted to the fixing portion 21b (FIG. 5). In the wire holding member 50 of this example, the ends of the respective fixed portions 51 on the free end side (protrusion direction side) are press-fitted to the fixing portion 21b, along a direction perpendicular to the cylinder axis direction of the holding portion 52. The fixing portion 21b is formed with a groove shape to enable the ends of the fixed portions 51 on the free end side to be fitted to the inner wall of the second housing chamber 20b of the housing main body 21 (FIGS. 5 to 8). The fixing portion 21b may be provided for each of the respective fixed portions 51 of one wire holding member 50, or may be provided as one space into which the respective fixed portions 51 of one wire holding member 50 are fitted. Here, the respective fixed portions 51 of one wire holding member 50 are fitted into a space constituting one fixing portion 21b. Further, this fixing portion 21b is provided to the second housing chamber 20b of the housing main body 21, for each of the wire holding members 50.

Figure 8:
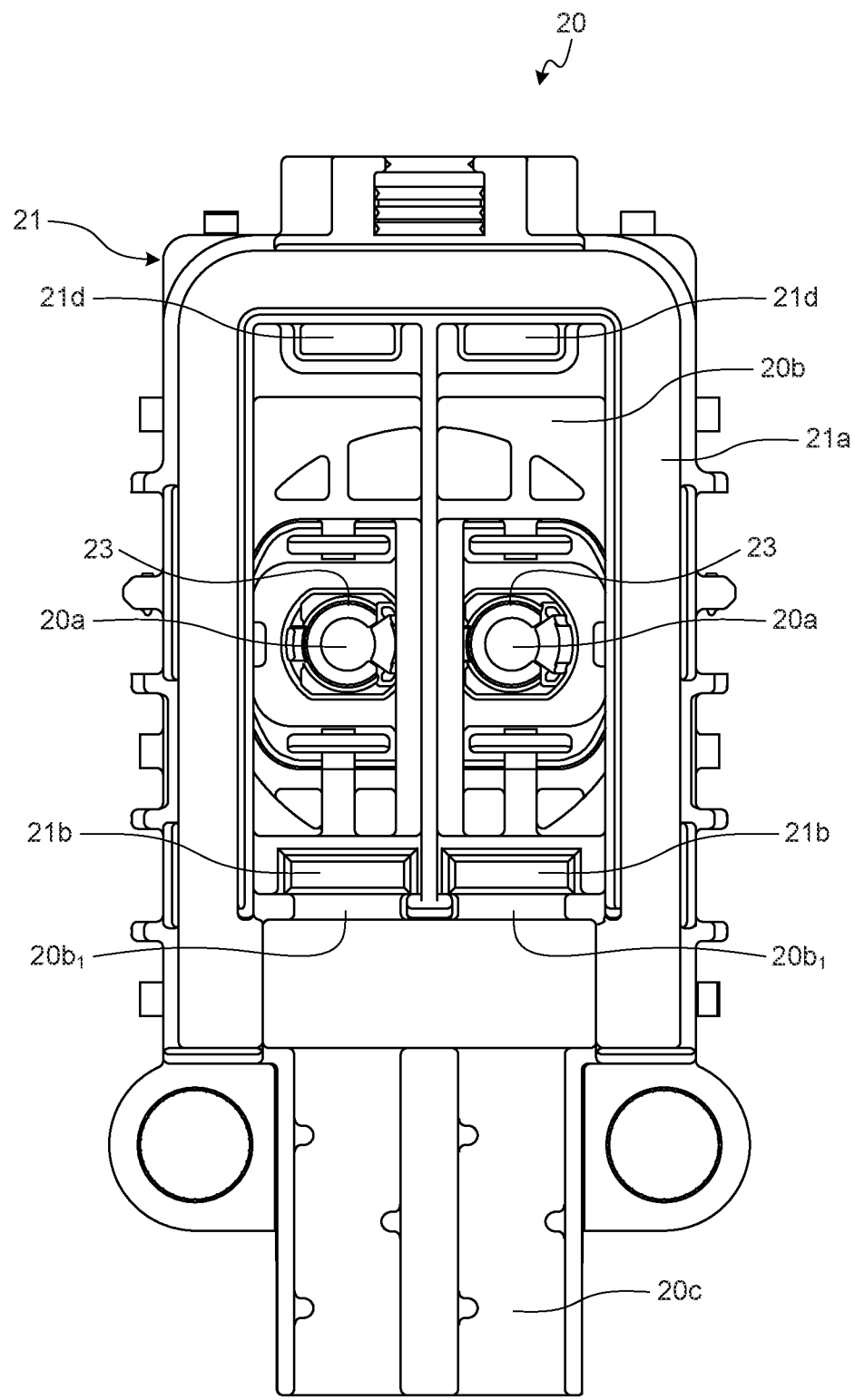
FIG. 8 is a plan view in which the housing main body is viewed from the open side thereof.

In addition, the fixing portion 21b, fixed portions 51, and holding portion 52 in this example are formed to enable the terminal of the wire We to be held from both sides between the holding portion 52 and the housing 20 when the fixed portions 51 are fixed to the fixing portion 21b (FIGS. 5 and 6). As indicated earlier, the holding portion 52 in this example is formed to enable the terminal of the wire We to be fitted concentrically to the inner circumferential surface thereof. Hence, when in a mutually fixed state, the fixing portion 21b and fixed portions 51 in this example are formed to enable the terminal of the wire We to be held from both sides between the inner wall surface $20b_1$ of the second housing chamber 20b of the housing main body 21, and the holding portion 52 (FIGS. 5 and 6). Note that the inner wall surface $20b_1$ in this example is disposed in a state of being offset in the cylinder axis direction of the holding portion 52, with respect to the fixing portion 21b (FIGS. 5 and 8).

For example, in the present embodiment, as indicated earlier, the core wire exposed portion We1a of the terminal of the wire We is contained on the inside of the housing 20 in a bent state in which the first core wire terminal portion We1b and second core wire terminal portion We1c intersect each other, and the second core wire terminal portion We1c of the core wire exposed portion We1a and the coated section of the terminal of the wire We are arranged opposite the opening 21a in the housing main body 21. Accordingly, the holding portion 52 in this example is formed to enable the coated section of the terminal of the wire We and/or the second core wire terminal portion We1c of the core wire exposed portion We1a of the terminal of the wire We to be held between the holding portion 52 and the housing 20. Here, the coated section of the terminal of the wire We is held between the holding portion 52 and the inner wall surface $20b_1$ of the housing 20. Further, the fixing portion 21b in this example is formed to enable the ends of the fixed portions 51 on the free end side to be fitted using the same orientation as the insertion direction of the terminal of the wire We into the second housing chamber 20b. The ends of the fixed portions 51 on the free end side are fitted to the fixing portion 21b when the terminal of the wire We to which the wire holding member 50 is connected is inserted into the second housing chamber 20b and third housing chamber 20c.

The wire holding member 50 illustrated here further includes a connecting portion 53 that is connected to a connected portion We1d of the core wire exposed portion We1a further on the terminal metal fitting 10 side than the holding portion 52 of the terminal of the wire We; and an electrical tested portion 54 that is tested using an electrical test instrument (not illustrated) which is inserted into the housing 20 from outside same (FIGS. 1, 2, 5, 7, and 9). Thus, as indicated earlier, the wire holding member 50 is molded using a conductive material such as a metal.

Figure 9:
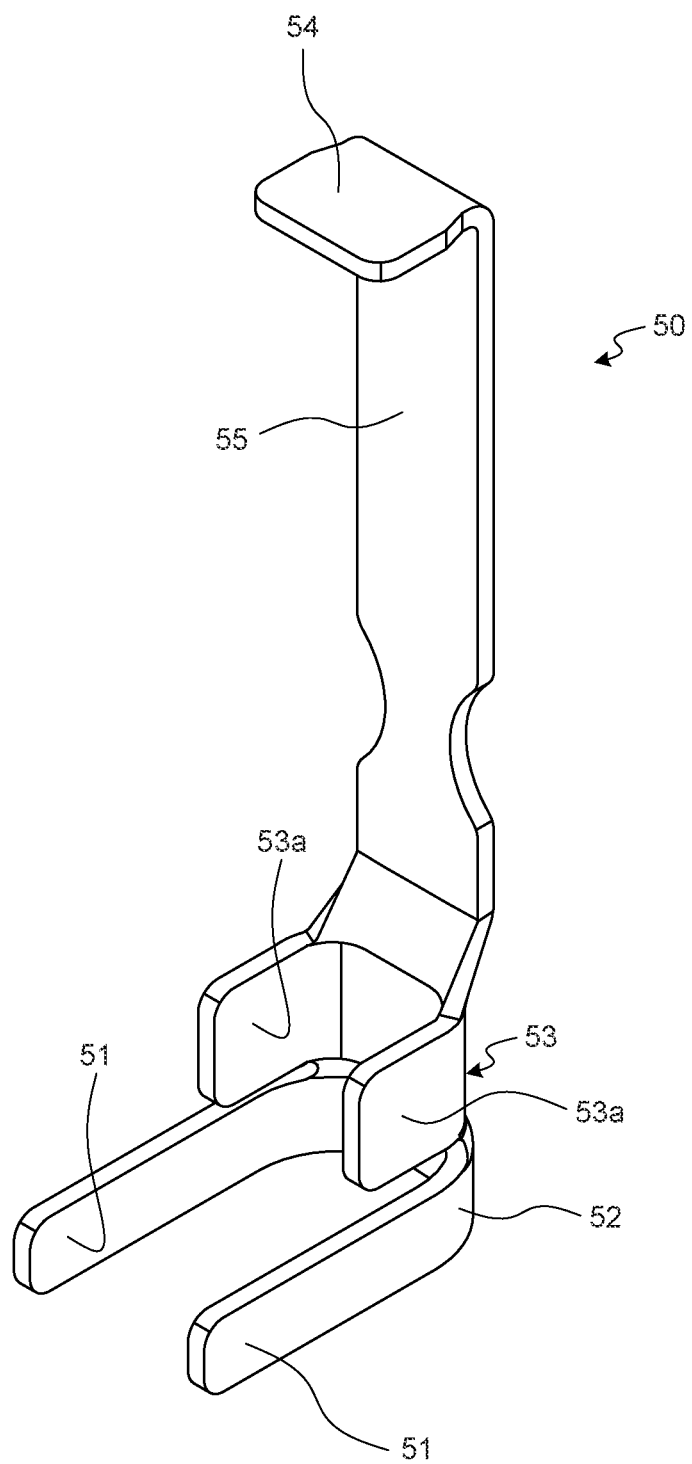
FIG. 9 is a perspective view of the wire holding member.

The connecting portion 53 in this example is formed in a U shape with two barrel pieces 53a, and is fixed through crimping while staking the two barrel pieces 53a to the connected portion We1d of the core wire exposed portion We1a (FIGS. 7 and 9). The connected portion We1d illustrated here is provided to the second core wire terminal portion We1c the core wire exposed portion We1a. The section of the second core wire terminal portion We1c in this example which is connected co the coated section of the terminal of the wire We is configured as the connected portion We1d. That is, the connecting portion 53 in this example is fixed by being crimped to the second core wire terminal portion We1c, close to the coated section of the terminal of the wire We which is to be held by the holding portion 52. Therefore, the connecting portion 53 in this example is disposed side by side with the holding portion 52 in the cylinder axis direction of the holding portion 52. Further, the holding portion 52 and connecting portion 53 in this example are formed to enable the terminal of the wire We to be concentrically fitted to the inner circumferential surface of the holding portion 52 in a state where the connecting portion 53 is connected to the connected portion We1d.

The electrical tested portion 54 is used to examine, using an electrical test instrument such as a test probe, whether or not the terminal metal fitting 10 and the wire We are in an energized state. The electrical tested portion 54 in this example is disposed on the side opposite to that of the holding portion 52 as viewed from the connecting portion 53 in the direction in which the holding portion 52 and connecting portion 53 are arranged. Here, the electrical tested portion 54 is disposed closer to the inner wall of the second housing chamber 20b than the core wire exposed portion We1a in order to enhance testing workability. Thus, the wire holding member 50 has a connecting portion 55 that connects the connecting portion 53 to the electrical tested portion 54 (FIGS. 1, 2, 5, 7 and 9). The electrical tested portion 54 and connecting portion 55 in this example are formed with mutually perpendicular, rectangular single-body shapes and form an L shape, The electrical tested portion 54 in this example has a flat surface perpendicular to the cylinder axis direction of the holding portion 52, and the projection direction toward the free end side as viewed from the connecting portion 55 side is aligned with the same orientation as the protrusion direction of the two fixed portions 51.

An electrical testing through-hole 21c, which enables an electrical test instrument to be inserted from outside and brings the electrical test instrument into contact with the electrical tested portion 54, is formed in the housing 20

(FIGS. 1, 2, 5, and 10). Further, a housing portion 21d for housing the electrical tested portion 54 is formed on the inside of the housing 20 (FIGS. 5 and 8). The electrical testing through-hole 21c and the housing portion 21d are made to communicate with each other in the housing 20. In addition, the electrical testing through-hole 21c and the housing portion 21d are provided in the housing 20 for each wire holding member 50.

Figure 10:
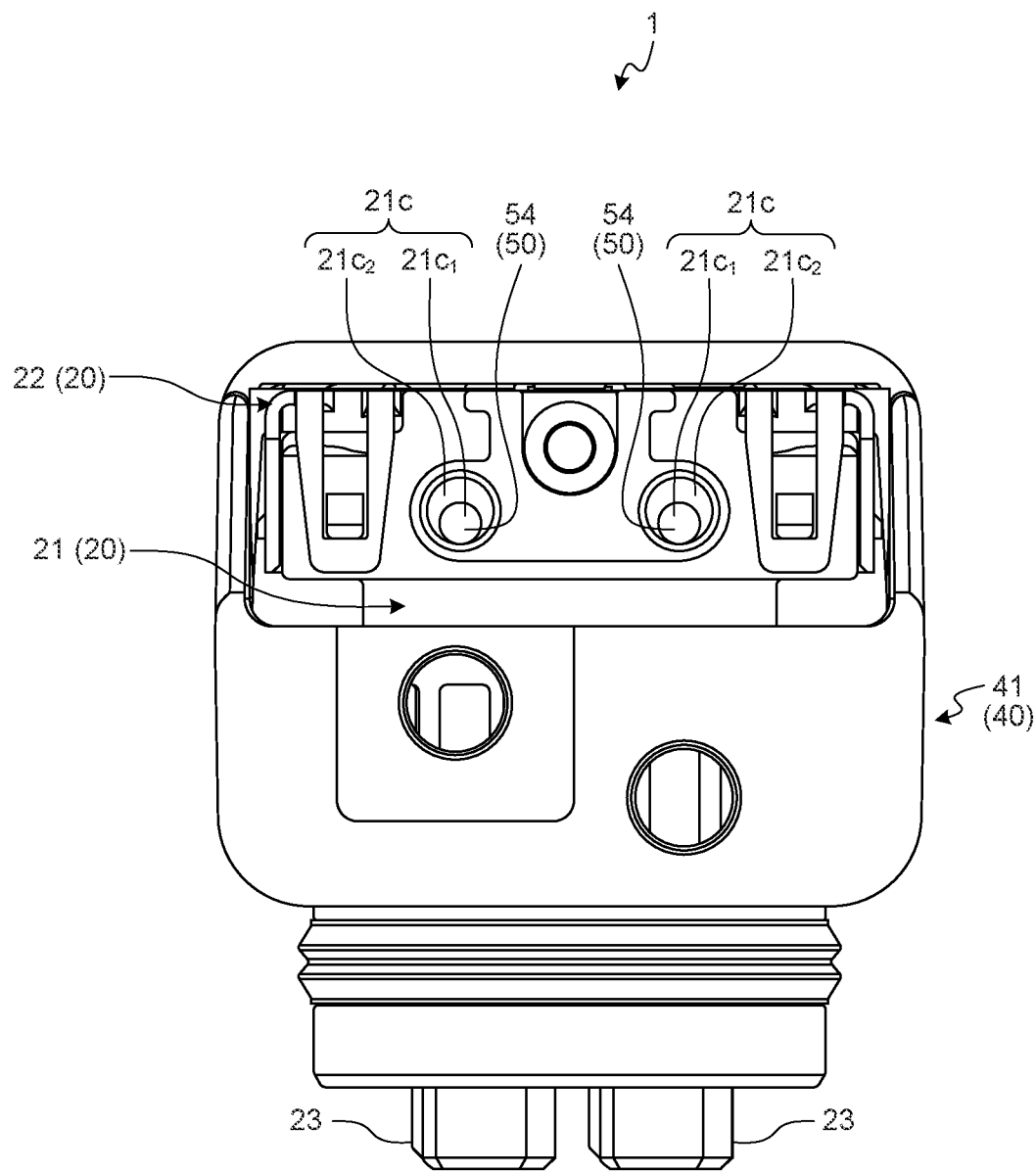
FIG. 10 is a plan view illustrating through-holes for electrical testing.

The electrical testing through-hole 21c in this example is formed in the housing main body 21. The electrical testing through-hole 21c has an axis such that the wire holding member 50 is rendered perpendicular to the flat surface of the electrical tested Portion 54 when the wire holding member 50 is housed in the second housing chamber 20b. The electrical testing through-hole 21c in this example has a first through-hole $21c_1$ that causes the outside of the housing main body 21 and the housing portion 21d of the second housing chamber 20b to communicate with each other and that enables the electrical test instrument to reach the housing portion 21d from outside the housing main body 21 (FIGS. 5 and 10). The housing portion 21d in this example is formed on the inner wall of the second housing chamber 20b in the housing main body 21 so to have a groove shape that connects to the first through-hole $21c_1$. The electrical tested portion 54 comes to be inserted into the housing portion 21d when the terminal of the wire We to which the wire holding member 50 is connected is inserted into the second housing chamber 20b and third housing chamber 20c.

The electrical testing through-hole 21c in this example has a second through-hole $21c_2$ that is made to communicate with the first through-hole $21c_1$ on the side of the first through-hole $21c_1$ opposite to that of the housing portion 21d, and into which second through-hole $21c_2$ a waterproof member 61 is fitted (FIGS. 5 and 10). The waterproof member 61 is a so-called rubber stopper molded from an elastic material such as synthetic rubber. The waterproof member 61 is fitted into the second through-hole $21c_2$ except when performing electrical testing (except when the connector 1 is disassembled, and so forth), and is drawn out from the second through-hole $21c_2$ and removed when performing electrical testing.

The first through-hole $21c_1$ and second through-hole $21c_2$ in this example each have an axis with the same orientation, the respective axis centers thereof being arranged eccentrically (FIG. 10).

In this example, a holding member 62, which collectively holds the waterproof members 61 of each of the wire holding members 50, is provided (FIGS. 1 to 5, and 10). The holding member 62 in this example is molded with a plate shape, and two waterproof members 61 are connected to each other by being fitted into a through-hole 62a (FIG. 5). Furthermore, the holding member 62 in this example is snap-locked to the housing main body 21 in a state where two waterproof members 61 are fitted into the second through-hole $21c_2$, except when performing electrical testing (except when the connector I is disassembled, and so forth). Further, when electrical testing is to be performed, the snap-locking cf the holding member 62 in this example is released, allowing the operator to pull the holding member 62 themselves while withdrawing the two waterproof members 61 from the second through-hole $21c_2$. The electrical test instrument is inserted via the second through-hole $21c_2$ and brought into contact with the electrical tested portion 54 of the housing portion 21d via the first through-hole $21c_1$.

As indicated hereinabove, even if swaying, caused by vibrations and the like in the wire We drawn outside the housing 20, occurs, the connector 1 according to the present embodiment is capable, by means of the fixed portions 51 and the holding portion 52 of the wire holding member 50, and the fixing portion 21b of the housing 20, of suppressing the transmission cf the swaying further on the terminal metal fittings 10 side than the holding portion 52 of the terminal of the wire We. Thus, the connector i is capable of suppressing an increased contact resistance between the terminal connecting portions 11 and terminal connecting portions 511, and hence enables vibration resilience performance to be improved.

In addition, because the wire holding member 50 of the connector 1 according to the present embodiment is provided with the electrical tested portion 54, components for improving resilience to vibrations and components for electrical testing do not need to be provided individually. Hence, the connector 1 enables an examination of whether or not the terminal metal fitting 10 and the wire We are in an energized state when maintenance is to be performed, and so forth, while improving vibration resilience performance even while reducing the number of components.

Here, the electrical tested portion 54 of the connector 1 according to the present embodiment may be formed so as to be fixed through press-fitting to the housing 20. That is, the electrical tested portion 54 and the housing portion 21d may be formed such that the electrical tested portion 54 is fixed through press-fitting to the housing portion 21d. The housing portion 21d in this case is formed with a groove shape to enable the electrical tested portion 54 to be fitted to the inner wall of the second housing chamber 20b of the housing main body 21. The electrical tested portion 54 comes to be fitted into the housing portion 21d when the terminal of the wire We to which the wire holding member 50 is connected is inserted into the second housing chamber 20b and third housing chamber 20c.

In this case, in the wire holding member 50, the fixed portion 51 and the electrical tested portion 54 are each fixed through press-fitting to the housing 20, the connecting portion 53 connected to the terminal of the wire We being placed between the fixed portion 51 and the electrical tested portion 54. Thus, when swaying, caused by vibrations and the like in the wire We drawn outside the housing 20, occurs, the connector 1 in this case is capable, by means of the fixed portions 51 and the holding portion 52 of the wire holding member 50, and the fixing portion 21b of the housing 20, of suppressing the transmission of the swaying further on the terminal metal fittings 10 side than the holding portion 52 of the terminal of the wire We, and the suppression effect can be improved by means of the housing portion 21d of the housing 20 and the electrical tested portion 54 of the wire holding member 50. Thus, the connector 1 in this case is capable of further suppressing an increased contact resistance between the terminal connecting portions 11 and terminal connecting portions 511, and hence enables vibration resilience performance to be further improved.

In addition, in the connector 1 according to the present embodiment, the cover member 22 may be attached to the housing main body 21 such that the relative movement and deformation of the wire holding member 50 with respect to the housing main body 21 are made to engage with the cover member 22. The cover member 22 in this example has a locking portion 22a that is made to protrude so as to lock the connecting portion 55 of the wire holding member 50 (FIG. 5). Accordingly, in this connector 1, when an input corresponding to the swaying of the wire We outside the housing 20 is applied to the wire holding member 50, the relative movement and deformation of the wire holding member 50 with respect to the housing main body 21 are engaged by the cover member 22, and hence a state in which the wire holding member 50 is press-fitted to the housing main body 21 can be maintained. Therefore, the connector 1 is capable of maintaining increased resilience to vibrations.

Even if swaying, caused by vibrations and the like in a wire drawn outside the housing, occurs, the connector according to the present embodiment is capable, by means of a fixed portion and a holding portion of a wire holding member, and a fixing portion of the housing, of suppressing the transmission of the swaying further on the terminal metal fitting side than the holding portion of the wire terminal. Thus, this connector is capable of suppress ng an increased contact resistance between a terminal metal fitting and a counterpart terminal metal fitting, and hence enables vibration resilience performance to be improved.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A connector, comprising:
    a terminal metal fitting to which a core wire exposed portion of a core wire of a terminal of a wire is physically and electrically connected;
    a housing inside which the terminal metal fitting and the terminal of the wire are housed and from which the wire is drawn outside the housing from inside the housing; and
    a wire holding member that holds, inside the housing, the terminal of the wire, wherein
    the wire holding member has a fixed portion that is fixed to a fixing portion inside the housing, and a holding portion that holds the terminal of the wire so that the terminal of the wire does not move relatively to the housing when the fixed portion is fixed to the fixing portion, and
    the fixing portion, the fixed portion, and the holding portion are formed such that the terminal of the wire is held from both sides between the holding portion and the housing when the fixed portion is fixed to the fixing portion.

2. The connector according to claim 1, wherein
    the fixing portion and the fixed portion are formed such that the fixed portion is fixed through press-fitting to the fixing portion.

3. The connector according to claim 2, wherein
    the wire holding member is molded from a conductive material and has a connecting portion that is connected to a connected portion of the core wire exposed portion further on the terminal metal fitting side than the holding portion of the terminal of the wire; and an electrical tested portion that is tested using an electrical test instrument which is inserted into the housing from outside of the housing.

4. The connector according to claim 3, wherein
    the core wire exposed portion of the terminal of the wire is divided into: a first core wire terminal portion, which is physically and electrically connected to the terminal metal fitting, and which is drawn out from the terminal metal fitting so as to have an orientation opposite to an insertion direction of the terminal metal fitting with respect to the housing; and a second core wire terminal portion, which is bent so as to intersect the first core wire terminal portion, and
    the connecting portion is connected to the connected portion of the second core wire terminal portion.

5. The connector according to claim 4, wherein
    the electrical tested portion is formed so as to be fixed through press-fitting to the housing.

6. The connector according to claim 3, wherein
    the electrical tested portion is formed so as to be fixed through press-fitting to the housing.

7. The connector according to claim 1, wherein
    the wire holding member is molded from a conductive material and has a connecting portion that is connected to a connected portion of the core wire exposed portion further on the terminal metal fitting side than the holding portion of the terminal of the wire; and an electrical tested portion that is tested using an electrical test instrument which is inserted into the housing from outside of the housing.

8. The connector according to claim 7, wherein
    the core wire exposed portion of the terminal of the wire is divided into: a first core wire terminal portion, which is physically and electrically connected to the terminal metal fitting, and which is drawn out from the terminal metal fitting so as to have an orientation opposite to an insertion direction of the terminal metal fitting with respect to the housing; and a second core wire terminal portion, which is bent so as to intersect the first core wire terminal portion, and
    the connecting portion is connected to the connected portion of the second core wire terminal portion.

9. The connector according to claim 8, wherein
    the electrical tested portion is formed so as to be fixed through press-fitting to the housing.

10. The connector according to claim 7, wherein
    the electrical tested portion is formed so as to be fixed through press-fitting to the housing.

* * * * *